United States Patent [19]

Riley

[11] 3,740,656

[45] June 19, 1973

[54] PULSE MODULATED SIGNAL DETECTOR

[75] Inventor: Russell B. Riley, Portola Valley, Calif.

[73] Assignee: Hewlett-Packard Company, Palo Alto, Calif.

[22] Filed: Jan. 3, 1972

[21] Appl. No.: 214,935

[52] U.S. Cl. ............... 329/104, 307/234, 325/326, 328/111, 329/106, 329/107, 330/10

[51] Int. Cl. ............................................ H03k 9/00

[58] Field of Search .................. 329/102, 104, 106, 329/107, 168; 332/15, 18, 19; 330/10; 325/42, 323, 326; 328/111, 112, 113; 307/234

[56] References Cited

UNITED STATES PATENTS

| | | | |
|---|---|---|---|
| 2,672,589 | 3/1954 | McLeod | 332/18 |
| 3,035,234 | 5/1962 | Hillman | 332/18 X |
| 3,518,548 | 6/1970 | Greefkes et al. | 325/326 X |
| 3,667,050 | 5/1972 | Gibson | 325/323 |
| 3,602,825 | 8/1971 | Senior | 307/234 X |

*Primary Examiner*—Alfred L. Brody
*Attorney*—A. C. Smith

[57] ABSTRACT

An improved automatic signal levelling circuit for pulsed radio frequency (RF) signals includes a sampling detector to eliminate distortion of the pulse-modulated RF signal.

2 Claims, 1 Drawing Figure

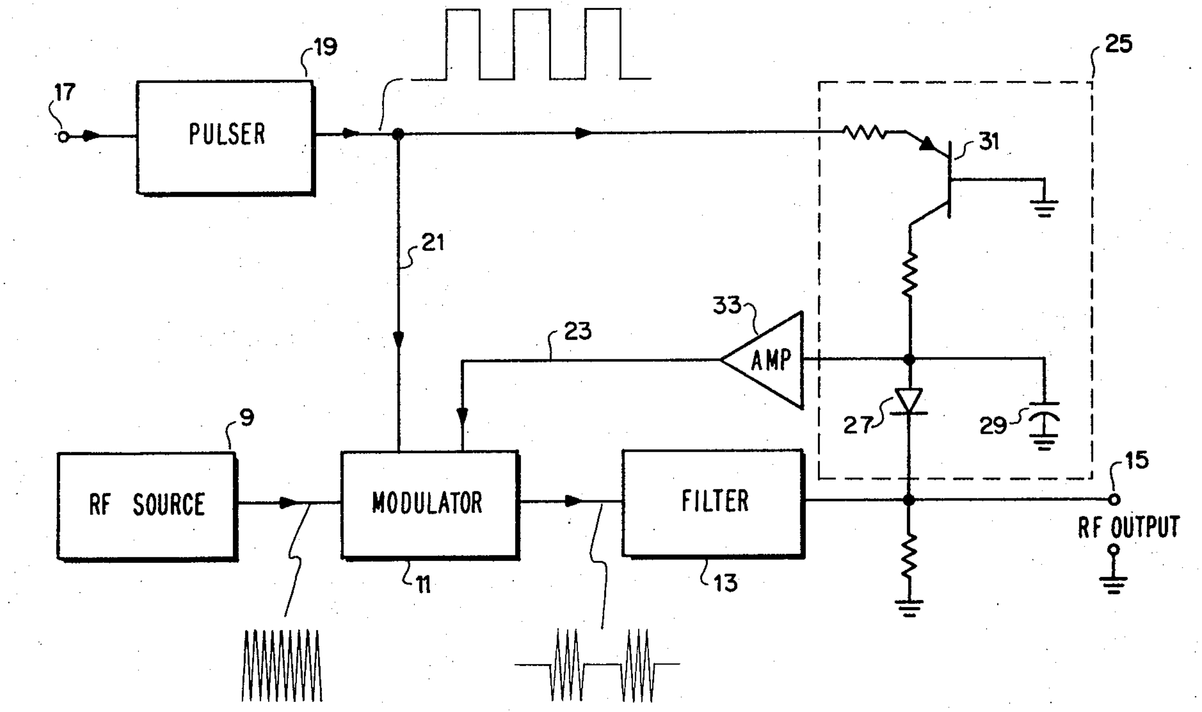
17
PULSER
19
21
25
31
33
AMP
23
27
29
9
RF SOURCE
MODULATOR
11
FILTER
13
15
RF OUTPUT

PULSE MODULATED SIGNAL DETECTOR

BACKGROUND AND SUMMARY OF THE INVENTION

Certain known signal levelling circuits for pulsed RF signals include conventional diode detectors and signal by-pass capacitors for producing the required level-controlling signals. One disadvantage encountered with circuits of this type is that the first few cycles of RF signal within a pulse burst are distorted in charging the by-pass capacitor of the detector circuit. This produces an undesirable rounding of the leading edge of the modulation envelope of the pulsed RF signal. This disadvantage of the conventional circuits is overcome in accordance with the present invention by utilizing a low-leakage diode as both a level detector and a sampling gate operated in synchronism with the modulating pulses.

DESCRIPTION OF THE DRAWING AND PREFERRED EMBODIMENT

Referring now to the drawing which shows a schematic diagram of the circuit of the present invention, a source 9 of high frequency or RF signal is connected through a modulator 11 and filter 13 to provide modulated RF signal at the output 15. Pulse-modulating input signal may be applied at input 17 to a pulser circuit 19 that is connected to supply modulating signal 21 to the modulator 11. The modulator 11 thus operates to produce bursts of RF signal at its output within a modulation envelope that is controlled in pulse position and duration by the pulsed modulating signal 21 and in pulse height by the level-controlling signal 23 that is combined with the modulating signal 21. Modulators which operate in this manner may include a conventional diode bridge circuit or a PIN diode array, as described in the literature (see, for example, U. S. Pat. No. 3,107,335, issued on Oct. 15, 1963, to J. K. Hunton et al).

In order to maintain control of the amplitude of the pulse modulation envelope, the detector circuitry 25 is connected to receive the RF output 15 and to produce a level-controlling signal 23 that is proportional to the peak amplitude of the RF signal during a pulse burst. A low-leakage diode 27 and a capacitor 29 are serially connected across the RF output to charge the capacitor 29 to the peak voltage occurring during a pulse burst of RF signal. However, the bias on the diode 27 is controlled by the bias circuit including the common-base transistor stage 31 in order to assure that the charge on the capacitor 29 remains undissipated between pulse bursts of RF signal. The emitter input to the common-base transistor stage 31 receives the pulse-modulating signal 21 and supplies forward bias signal to the diode 27 only during some portion of the modulating pulse period. Isolation provided by the diode 27 and by the collector circuit of the transistor 31 which are rendered nonconductive between pulse periods thus assures that capacitor 29 remains disconnected from the surrounding circuitry during the period between pulse bursts. The stored charge and, hence, the voltage on capacitor 29 remains substantially unchanged between pulse bursts of RF signal. This substantially eliminates distortion of the RF signal because no significant amount of charge need be supplied to the capacitor 29 in each pulse burst of RF signal. An amplifier 33 having sufficiently high input impedance to prevent any significant discharge of the capacitor 29 between pulse periods is connected to the capacitor 29 to produce the requisite level-controlling signal 23 proportional to the voltage across capacitor 29.

I claim:

1. Signalling apparatus comprising:

modulator means for modulating an applied RF signal in response to control signal applied thereto;

source means of pulse-modulating signal connected to said modulator means for pulse modulating the applied RF signal;

detector means connected to receive the modulated RF signal for applying to said modulator means a control signal representative of the amplitude of the modulated RF signal;

said detector means including a capacitor and unidirectional conduction apparatus connected in a series circuit to receive said modulated RF signal, and including circuit means coupled to said source means and to said unidirectional conduction apparatus for supplying conduction-enabling signal thereto only during a selected portion of said pulse-modulating signal to supply to and store in said capacitor an amount of charge representative of the amplitude of the pulse-modulated RF signal.

2. Signalling apparatus as in claim 1 wherein:

the unidirectional conduction apparatus of said detector means includes a diode;

said circuit means includes a transistor having first and second electrodes forming an input circuit and having second and third electrodes forming an output circuit;

means coupling the input circuit of the transistor to receive said pulse-modulating signal; and means coupling the output circuit of said transistor to said diode for supplying said conduction-enabling signal thereto.

* * * * *